United States Patent [19]

Parr

[11] Patent Number: 4,751,479

[45] Date of Patent: Jun. 14, 1988

[54] REDUCING ELECTROMAGNETIC INTERFERENCE

[75] Inventor: Gordon R. Parr, Bishop's Cleeve, England

[73] Assignee: Smiths Industries Public Limited Company, London, England

[21] Appl. No.: 903,928

[22] Filed: Sep. 4, 1986

[30] Foreign Application Priority Data

Sep. 18, 1985 [GB] United Kingdom ............... 8523104

[51] Int. Cl.⁴ .......................... H03H 7/01; H03H 7/09
[52] U.S. Cl. ..................................... 333/12; 333/181; 333/184; 333/185
[58] Field of Search .......... 333/12, 167, 168, 175–176, 333/181–185, 177–180; 361/107–108, 118–119, 111–113; 336/96, 174–175, 212, 221, 233, 234

[56] References Cited

U.S. PATENT DOCUMENTS

| | | | |
|---|---|---|---|
| 1,994,905 | 3/1935 | Bowles | 333/12 |
| 3,638,144 | 1/1972 | Denes | 333/182 |
| 3,683,271 | 8/1972 | Kobayashi | 333/177 X |
| 4,342,013 | 7/1982 | Kallman | 333/181 |
| 4,378,539 | 3/1983 | Swanson | 333/177 |
| 4,636,752 | 1/1987 | Saito | 333/185 X |
| 4,656,451 | 4/1987 | Pomponio | 333/12 X |

FOREIGN PATENT DOCUMENTS

| | | |
|---|---|---|
| 0126446 | 11/1984 | European Pat. Off. . |
| 0117711 | 7/1983 | Japan ................................ 333/182 |
| 340144 | 12/1930 | United Kingdom . |
| 544144 | 3/1942 | United Kingdom . |
| 1159425 | 7/1969 | United Kingdom . |
| 1258854 | 12/1971 | United Kingdom . |

Primary Examiner—Marvin L. Nussbaum
Attorney, Agent, or Firm—Pollock, Vande Sande and Priddy

[57] ABSTRACT

An avionics housing has electrical equipment within it connected to an electrical connector by means of a flexi-rigid assembly having multiple conductive tracks extending side-by-side on an insulating layer. Radio frequency interference between the connector and the equipment is reduced by forming the flexi-rigid assembly into one or more loops about a ferrite block which absorbs radio frequency on the conductive tracks. The housing may have several blocks of different materials which absorb radiation of different frequency ranges. Additionally, the assembly may be wound about a plastics block to form an air-cored coil for absorbing higher frequencies. Where only higher frequencies are to be absorbed, the air-cored coil may take the place of the ferrite block. The flexi-rigid assembly also includes a capacitor assembly in the form of two conductive layers extending across opposite side of the conductor tracks and insulated therefrom. The housing has a screened box which screens the connector and the loops in the flexi-rigid assembly from the electrical equipment.

13 Claims, 3 Drawing Sheets

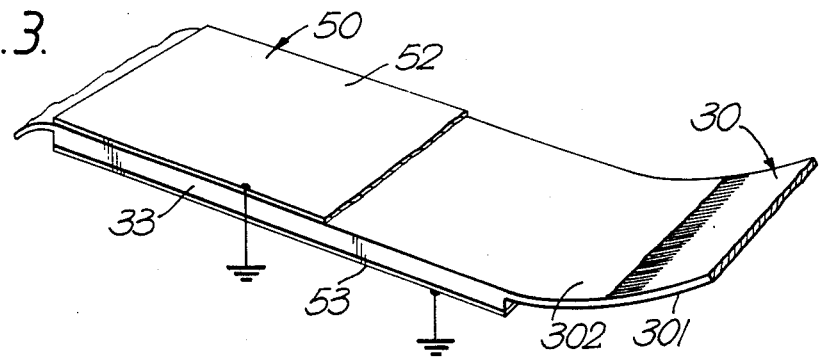
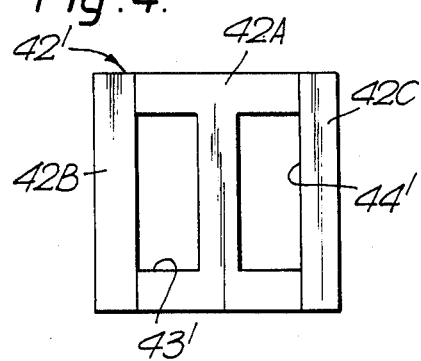
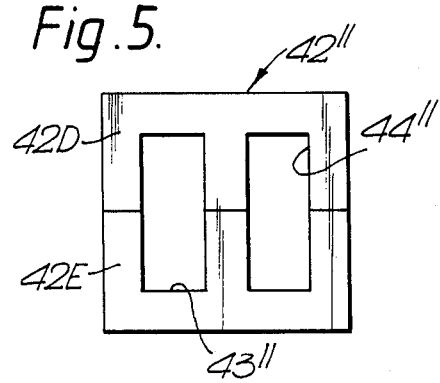
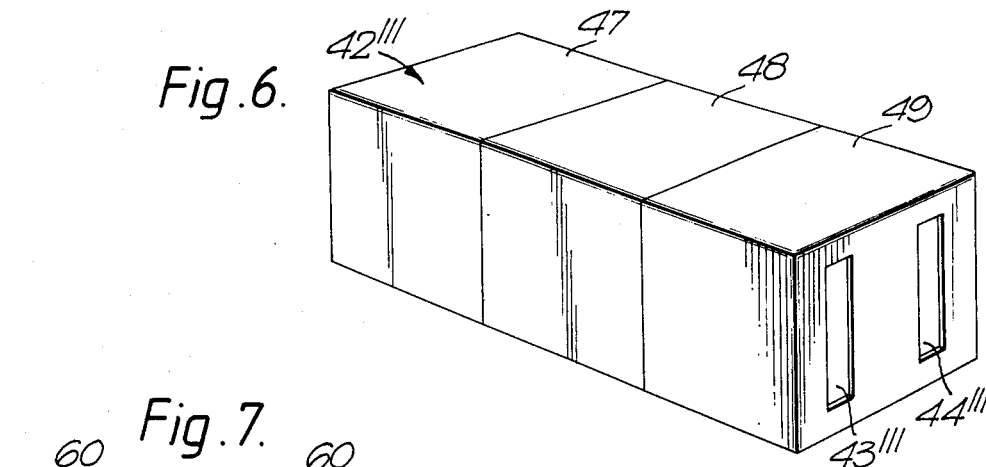
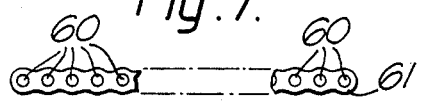
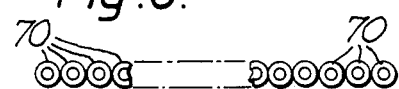

REDUCING ELECTROMAGNETIC INTERFERENCE

BACKGROUND OF THE INVENTION

This invention relates to arrangements for reducing electromagnetic interference.

The invention is more particularly concerned with arrangements for reducing interference in electrical equipment such as, for example, avionics units.

In many environments, such as that of an aircraft or ship, there can be a large amount of radio frequency interference from electrical apparatus in the vicinity. Avionics units and the like can also be susceptible to interference from lightning and from electromagnetic pulses caused by nuclear explosions. In order to ensure the reliability of avionic equipment and to ensure that it is available for use during flight, it is important that such interference is reduced to a minimum. This is conventionally achieved by screening the equipment casing and cables connected with the equipment, and by the use of filters.

Screened cables are, however, generally undesirable because of their increased weight and size. Also, they can be prone to corrosion and require complicated connections at their ends. The use of filters which obviate the need to screen cables is therefore advantageous. Such filters, can be incorporated into a connector, such as described in patent application GB No. 2025158A. Such connectors include an individual filter element around each connector pin which supports the pin in a ground plane. These filter elements, however, are very fragile and tend to become broken during use leading to failure of the filter. In a multi-pin connector, failure of one of the filter elements can lead to radio frequency interference passing into the equipment housing and degrading the signals on all the other lines.

In avionics units there may be as many as four hundred individual connector pins each of which has to be filtered. This leads to a very high cost of the filter-connector and increases the risk of interference entering the housing through a failed filter.

BRIEF SUMMARY OF THE INVENTION

It is an object of the present invention to provide an arrangement for reducing interference by which the above-mentioned disadvantages can be alleviated.

According to one aspect of the present invention there is provided an arrangement for reducing interference on a plurality of electrical conductors including a block of material providing impedance to the flow of radio frequency interference currents, said electrical conductors being wound together to form at least one loop about said block such that radio frequency interference on said conductors is absorbed to a substantial extent by said block.

The block may have two passages therethrough, said conductors extending along a first of the passages in one direciton and along a second of the passages in the opposite direction. The block is preferably of a ferrite material. The conductors may be formed into a plurality of turns about said block. The conductors preferably extend side-by-side along an electrical conductor assembly that is wound to form the loop about said block. The conductor assembly is preferably a flexi-rigid assembly.

The conductor assembly may also be wound into a plurality of turns such as to form an air-cored coil that absorbs to a substantial extent radio frequency interference on said conductors of a higher frequency than the interference absorbed by said block. The conductor assembly may include a capacitor assembly comprising first and second planar conductive elements extending across said conductors on opposite sides of said assembly and insulated from said conductors, said planar conductive elements being connected to ground. The said block may be enclosed within an electrically-conductive box that provides screening for said block. The block may be made by joining together a plurality of parts which may be identical and of E-shape in section.

The arrangement may include a plurality of blocks, said electrical conductors being wound to form a loop about each block. Each block is preferably of a different material such that each block provides absorption of different frequencies of interference.

According to another aspect of the present invention there is provided an arrangement for reducing interference on an electrical conductor assembly of the kind comprising a plurality of electrical conductors extending side-by-side alaong the length of the assembly, the assembly being wound into a plurality of turns thereby to form an air-cored coil that absorbs to a substantial extent radio frequency interference.

According to a further aspect of the present invention there is provided a housing containing electrical equipment, an electrical connector for making external electrical connection to the equipment in said housing, and an electrical conductor assembly having a plurality of electrical conductors that extend side-by-side along the conductor assembly for making electrical connection within the housing between the connector and the equipment, the electrical conductor assembly being wound to form at least one loop that provides impedance to the flow of radio frequency currents such that radio frequency interference on said conductors is absorbed to a substantial extent by said loop. The housing may include a block of material that provides impedance to the flow of radio frequency currents, the electrical conductor assembly being wound to form a loop about said block such that radio frequency interference on said conductors is absorbed to a substantial extent by said block. The block and at least that part of the electrical assembly between the block and the connector are preferably screened from the electrical equipment within the housing.

An avionics housing containing electrical equipment and including an interference reducing arrangement in accordance with the present invention, will now be described, by way of example, with reference to the accompanying drawings.

BRIEF DESCRIPTION OF THE DRAWINGS

FIG. 3 is an enlarged perspective view of another part of the interference reducing arrangement;

FIGS. 4, 5 and 6 shows alternatives to the part shown in FIG. 2;

FIGS. 7 and 8 shows alternative conductors used in the filtering arrangement;

DETAILED DESCRIPTION

Figure 1:
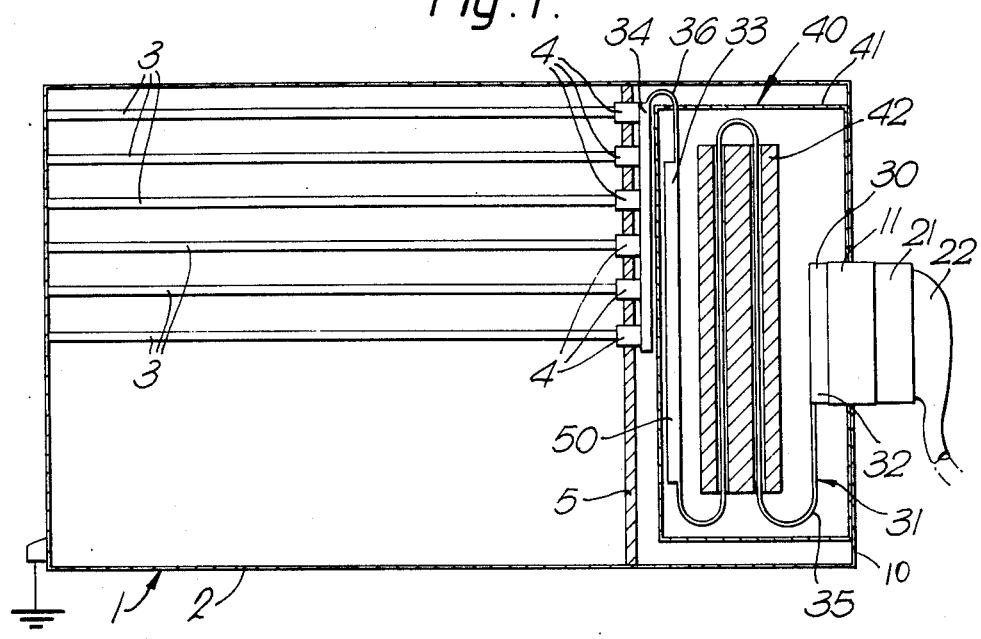
FIG. 1 is a sectional plan view of the housing.
Figure 2:
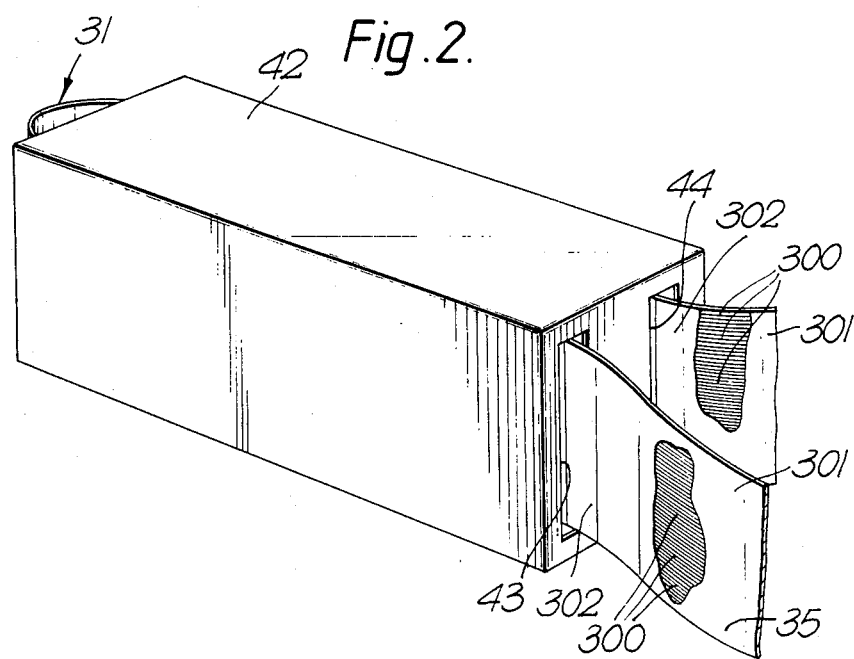
FIG. 2 is an enlarged perspective view of a part of the interference reducing arrangement.

With reference first to FIGS. 1 to 3, the housing 1 has an outer metal casing 2 that is grounded and that is constructed to screen the contents of the casing from conducted and radiated external radio frequency interference. The housing 1 contains electrical equipment in the form of electronic circuit boards 3, electrical connection being made to these boards via connectors 4 mounted on a backplane 5 which extends across the housing toward its rear end.

Mounted on the rear wall of the casing 2 is multi-pin connector 11, which typically may have four hundred pins. External electrical connection to the connector 11 is made by means of a mating connector 21 at the end of an aircraft type cable 22. The cable 22 need not be screened, thereby keeping its size and weight to a minimum and simplifying connection of its individual conductors with the connector 21.

Within the housing 1, the connector 11 is electrically connected, such as by soldering, to one end 30 of a flexi-rigid conductor assembly 31 which carries four hundred parallel metal tracks 300 (FIG. 2) extending side-by-side in a row, or in several superimposed layers, between opposite ends of the assembly.

Flexi-rigid assemblies of this kind are well known and comprise rigid regions and flexible regions joined with one another. The flexible regions are formed by a common flexible plastics sheet 301 on which are printed the desired pattern of conductive tracks 300, the upper surface of the tracks being protected by an insulating layer 302. The rigid regions are formed by stiffening the flexible plastics sheet by backing or facing it with other layers joined to each other with rigid epoxy or similar material. Contact to individual tracks can be made in the rigid regions such as by means of plated-through holes.

In the present example, the flexi-rigid assembly 31 has three rigid portions 32 to 34 separated from one another by two respective flexible portions 35 and 36. Two of the rigid portions 32 and 34 are located at opposite ends of the assembly 31, one portion 32 being joined with the connector 11 so that individual tracks of the assembly make electrical connection with respective pins of the connector. The rigid portion 34 at the opposite end is joined with each of the backplane connectors 4, the tracks of the flexi-rigid assembly 31 making direct, unbroken connection between contact elements in connectors 4 and respective contact elements in the connector 11. The rigid portion 34 also serves to interconnect different backplane connectors. The intermediate rigid portion 33 supports a capacitor assembly 50 which is described in greater detail below.

The flexible portion 35 of the assembly 31, which starts from close to its rear end 30, extends through a radio frequency interference reducing unit indicated generally by the numeral 40. The unit 40 is contained within a metal box 41 which is joined to the rear wall 10 of the casing 2 and which provides interference screening within the casing for the inner part of the connector 11 and the interference reducing unit 40. The unit 40 includes a block 42 of a ferrite material, which is shown in greater detail in FIG. 2. The block 42 is rectangular in section and has two parallel, rectangular passageways 43 and 44 which extend through the entire length of the block. Each passageway 43 and 44 is wide enough to accommodate the flexible portion 35 of the assembly 31 which extends along one passageway 43, in one direction, and is looped to extend along the other passageway 44, in the opposite direction, so that both ends of the assembly project from the same end of the block to form a single turn.

Also contained within the interference reducing unit 40 is the capacitor assembly 50, which is shown in greater detail in FIG. 3. The capacitor assembly 50, is formed on the intermediate rigid portion 33 of the flexi-rigid assembly 31 and comprises two layers 52 and 53 of copper metal extending across the conductors of the flexi-rigid assembly and insulated from them by the insulative layers 301 and 302 of the assembly. The layers 52 and 53 thereby constitute the electrodes of a parallel plate capacitor and are both grounded by electrical connection to the metal box 41 and thence to the casing 2 of the housing 1.

This arrangement provides a degree of capacitance (typically between about 200 pF to 1000 pF) for the conductors which may be sufficient for some applications. Increased capacitance may be provided as necessary by individual, standard, low-cost capacitors mounted on the rigid portion 33. One end of each capacitor would be connected to each respective conductor track 300 and the other end connected to the grounded layers 52 and 53.

It is not essential for the capacitor assembly 50 to be contained within the unit 40, it may instead be located externally of the unit 40 within the housing 1.

The ferrite block 42 and the capacitor assembly 50 provide an absorptive filter for radio frequency interference between approximately 10 KHz and 300 MHz and can give an attenuation of between 40 dB and 60 dB over this frequency range.

The ferrite block 42 may be made by moulding and sintering as a single piece or from several pieces as shown in FIGS. 4 or 5. FIG. 4 shows a block 42' made from three pieces: a central piece 42A or H-shape section and two side pieces 42B and 42C of rectangular section bridging and joined to the arms of the central piece 42A. FIG. 5 shows a block 42'' made of two identical pieces 42D and 42E of E-shape in section and joined together at their arms.

Figure 9:
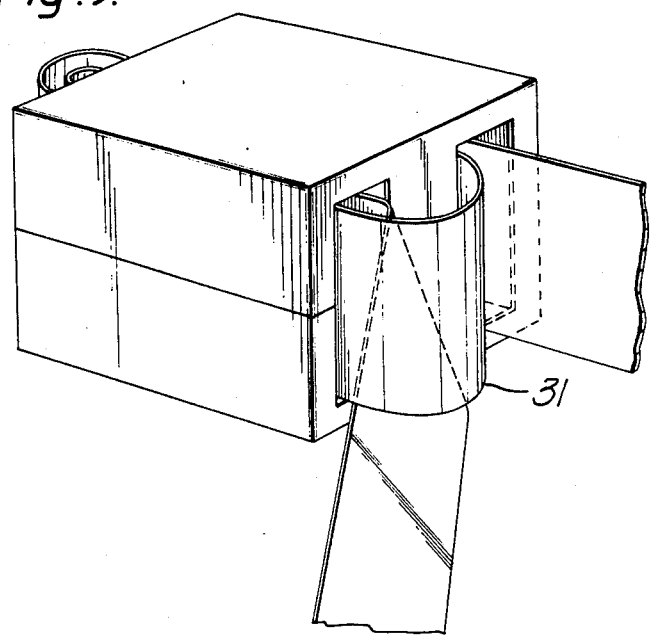
FIG. 9 is a perspective view of an alternative interference reducing arrangement.

The flexi-rigid assembly 31 may make more than one turn within the ferrite block, such as shown in FIG. 9. The assembly 31 may emerge from the ferrite block at different ends if more convenient or if the required number of turns dictates this.

It is possible to vary the frequency range of interference filtering by suitable choice of inductive, absorptive materials. Furthermore, the frequency range can be extended by combining materials having different frequency/impedance characteristics. For example, as shown in FIG. 6, the block 42''' is made up of three separate pieces 47, 48 and 49 joined end to end along the length of the block. Each piece 47 to 49 is made of a different ferrite which has a different frequency/impedance characteristic so that the combined impedance of the block 42''' is thereby extended.

It will be appreciated that the block 42 need not be of rectangular shape but could be shaped differently to fit compactly into available space. The passageways 43 and 44 through the block 42 are selected to accommodate the conductors passing therethrough and could be of different shape according to the nature of the conductors.

Where only interference filtering of higher frequencies is required, the flexi-rigid assembly may be wound to form an air-cored coil For example, the block 42 shown in FIG. 1 may be of a plastics or other non-magnetic material that does not contribute to impedance, but instead merely provides a structural support to retain the assembly in the shape of a coil.

Figure 10:
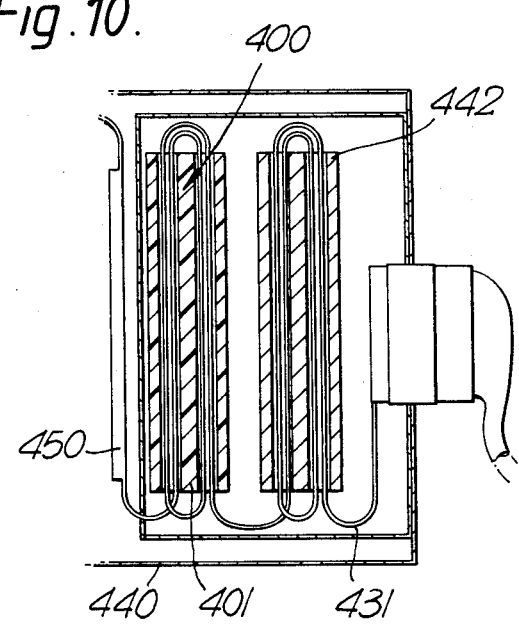
FIG. 10 is a sectional plan view of a part of an alternative housing.

The flexi-rigid assembly may be formed into an air-cored coil in addition to extending through a ferrite block, as shown in FIG. 10. In this arrangement the flexi-rigid assembly 431 makes two turns through a ferrite block 442 and makes two turns in an air-cored coil 400 formed by a plastics block or former 401 both of which are located within an interference reducing unit 440. A capacitor assembly 450 is located externally of the unit 440. In such an arrangement the ferrite block 442 provides filtering of medium and lower frequencies while the air-cored coil 400 provides filtering of the higher frequencies.

The conductors need not be formed as plated tracks on a flexi-rigid assembly but could instead, for example, be provided by wires 60 extending along a ribbon cable 61, such as shown in FIG. 7 or by individual, separate wires 70 such as shown in FIG. 8.

The arrangement of the present invention can provide efficient filtering of radio frequency interference mainly by absorption. Absorption filtering of this kind has advantages over reflective filtering because, while reflective filtering may reduce interference entering the housing, it does this by reflecting it back along the aircraft cable causing possible interference problems in other equipment. Absorption filtering by contrast, reduces the overall amount of interference on the cable. In the arrangement described, the ferrite block is selected to provide considerable radio interference absorption compared with its reflective filtering characteristic.

Because efficient filtering can be provided, the need to screen aircraft cables supplying signals to the housing is removed. This thereby enables a reduction in the weight and size of the aircraft cables to be achieved and also avoids the corrosion problems sometimes associated with screened cables. Electrical connection of unscreened cables is also considerably simpler than that of screened cables.

The connector 11 used on the wall of the housing can be of standard form and more rugged than filtered connectors used previously. The present arrangement also avoids another disadvantage of filtered connectors, in that the overall interference filtering integrity is vulnerable to a failure of any one of the pins.

The simple construction of the ferrite block also leads to a considerable reduction in the cost of providing a filter.

In addition to filtering interference signals supplied to the input of the housing 1 from external sources, the filter will also remove interference on signals at the output of the housing which arise from radio interference generated within the housing.

It will be appreciated that, where some of the valid input or output signals supplied to or from an avionics unit are in a frequency range that would normally be attenuated by the interference filtering of the present invention, these signals can be suplied to the input of the housing through a separate connector by means of separate screened aircraft cables. In this arrangement the screening of the aircraft cables would provide interference suppression and the interference reducing unit 40 would be bypassed.

The use of a capacitor formed by two plates extending across a plurality of conductors, in the manner described above, has advantages in that the labour of joining individual capacitors to respective conductors is avoided, together with the risk that a joint or capacitor may become faulty and reduce the integrity of the entire interference reducing arrangement. It can be seen that, in the present arrangement it is possible to provide interference reduction along a continuous, unbroken connection between the connector on the rear of the housing and the backplane connectors. The ferrite block used in the present invention can be relatively large and rugged making it highly resistant to damage compared with previous multiple filter connectors. The risk of one large, rugged ferrite block failing is obviously considerably less than the risk of failure of one small, delicate filter element in an array of several dozen or hundreds of such elements. The risk of damage to the ferrite block is further reduced compared with previous filter elements because there does not need to be any direct mating contact with the ferrite block. With the arrangement of the present invention the risk of damage caused by differential thermal expansion, vibration and mating damage can thereby be reduced by suitable mounting of the block separate from the mating parts of the connectors.

What I claim is:

1. An arrangement for reducing interference on a plurality of continuous, unbroken electrical conductors that extend side-by-side along a planar electrical conductor assembly, said arrangement including a block of material providing impedance to the flow of radio frequency interference currents, said electrical conductor assembly being wound to form at least one loop about said block, a capacitor assembly comprising at least one planar electrically conductive element extending across said electrical conductors on one side of said planar conductor assembly, means insulating said conductive element from said conductors, and means connecting said planar conductive element to ground, such that radio frequency interference on said conductors is attenuated to a substantial extent by said block and said capacitor assembly.

2. An arrangement according to claim 1, wherein said block is of a
ferrite material.

3. An arrangement according to claim 1, wherein said conductor assembly is formed into a plurality of turns about said block.

4. An arrangement according to claim 1, wherein the said conductor assembly is also wound into a plurality of turns such as to form an air-cored coil that absorbs to a substantial extent radio frequency interference on said conductors of a higher frequency than the interference absorbed by said block.

5. An arrangement according to claim 1 wherein said capacitor assembly comprises first and second planar conductive elements extending across said conductors on opposite sides of said conductor assembly, both of said conductive elements being insulated from said conductors, and both of said planar conductive elements being connected to ground.

6. An arrangement according to claim 1, wherein the said block is enclosed within an electrically-conductive box that provides screening for
said block.

7. An arrangement according to claim 1, wherein said block is made by joining together a plurality of parts.

8. An arrangement according to claim 1, including a plurality of blocks, said conductor assembly being wound to form a loop about each block, each block being of a different material such that each block provides absorption of different frequencies of interference.

9. An arrangement for reducing interference on a planar electrical conductor assembly of the kind comprising a plurality of continuous, unbroken electrical conductors extending side-by-side along the length of the conductor assembly, wherein the conductor assembly is wound into a plurality of turns thereby to form an air-cored coil, and wherein the interference reducing arrangement also includes a capacitor assembly comprising at least one planar electrically conductive element extending across the said electrical conductors on one side of said conductor assembly, means insulating said conductive element from said conductors, and means connecting said planar conductive element to ground such that radio frequency interference on said conductors is attenuated to a substantial extent by said air-cored coil and said capacitor assembly.

10. A housing containing electrical equipment, an electrical conductor for making external electrical connection to the equipment in said housing, and a planar electrical conductor assembly having a plurality of continuous, unbroken electrical conductors that extend side-by-side along said conductor assembly to make electrical connection within the housing between said electrical connector and said electrical equipment, the electrical conductor assembly being wound to form at least one loop that provides impedance to the flow of radio frequency currents, and the housing also including a capacitor assembly comprising at least one planar electrically conductive element extending across the said electrical conductors on one side of the conductor assembly, said planar conductive element being insulated from said conductors and connected to ground, such that radio frequency interference on said electrical conductors is attenuated to a substantial extent by said loop and said capacitor assembly.

11. A housing according to claim 10, wherein the housing includes a block of material that provides impedance to the flow of radio frequency currents, the electrical conductor assembly being wound to form a loop about said block such that radio frequency interference on said conductors is absorbed to a substantial extent by said block.

12. A housing according to claim 11, wherein said block is of a ferrite.

13. A housing according to claim 11, including conductive means screening the said block and at least that part of the electrical conductor assembly between the block and the connector from the electrical equipment within the housing.

* * * * *